(12) United States Patent
Kwong et al.

(10) Patent No.: US 6,399,898 B1
(45) Date of Patent: Jun. 4, 2002

(54) TECHNIQUE FOR COUPLING SIGNALS BETWEEN CIRCUIT BOARDS

(75) Inventors: Herman Kwong, Kanata; Richard R. Goulette, Arnprior, both of (CA)

(73) Assignee: Nortel Networks Limited (CA)

( * ) Notice: Subject to any disclaimer, the term of this patent is extended or adjusted under 35 U.S.C. 154(b) by 0 days.

(21) Appl. No.: 09/660,196

(22) Filed: Sep. 12, 2000

Related U.S. Application Data

(63) Continuation-in-part of application No. 09/443,128, filed on Nov. 18, 1999.

(51) Int. Cl.[7] .......................... H01R 12/09; H05K 1/11
(52) U.S. Cl. ..................................... 174/261; 361/784
(58) Field of Search ............................... 174/261–266, 174/255; 361/777–780, 794, 799, 800, 784, 803; 29/830

(56) References Cited

U.S. PATENT DOCUMENTS

| | | | | | |
|---|---|---|---|---|---|
| 4,868,350 A | * | 9/1989 | Hoffarth et al. | ............ | 174/68.5 |
| 5,191,174 A | * | 3/1993 | Chang et al. | ............... | 174/266 |
| 5,432,486 A | | 7/1995 | Wong | .......................... | 333/109 |
| 5,736,679 A | * | 4/1998 | Kresge et al. | ............... | 174/250 |
| 6,180,215 B1 | * | 1/2001 | Sprietsma et al. | .......... | 428/209 |
| 6,184,478 B1 | * | 2/2001 | Imano et al. | ............... | 174/261 |

* cited by examiner

Primary Examiner—Kamand Cuneo
Assistant Examiner—Jeremy Norris
(74) Attorney, Agent, or Firm—Hunton & Williams

(57) ABSTRACT

A technique for coupling a signal between a first circuit board and a second circuit board. In one embodiment, the first circuit board has a first signal conductor formed therein, and the second circuit board has a second signal conductor formed therein. Also, the first signal conductor is shielded by a first electrically conductive shield, and the second signal conductor is shielded by a second electrically conductive shield. In this embodiment, the technique is realized by forming a first opening in the first electrically conductive shield so as to expose the first signal conductor in the first circuit board, and forming a second opening in the second electrically conductive shield so as to expose the second signal conductor in the second circuit board. The first circuit board and the second circuit board are then positioned such that the first opening and the second opening are aligned and a signal propagating along the first signal conductor is coupled to the second signal conductor.

22 Claims, 5 Drawing Sheets

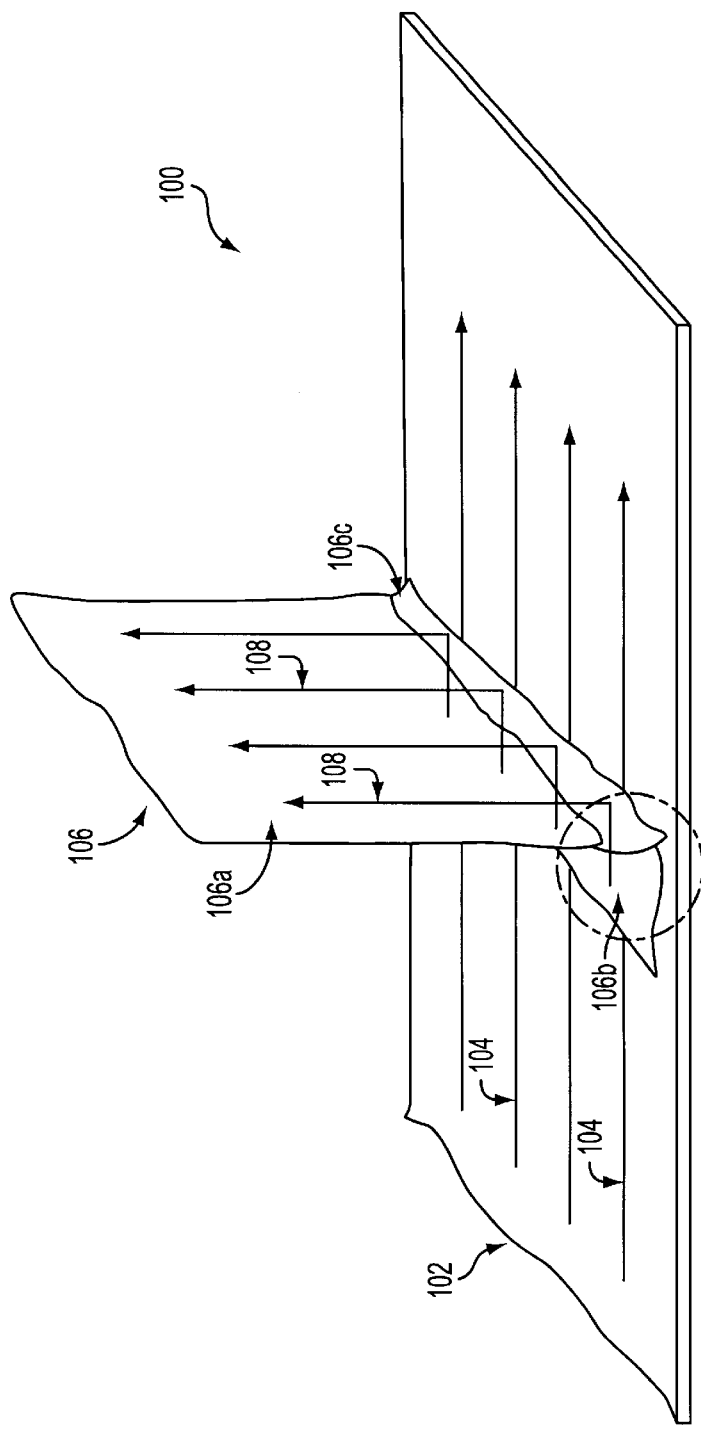
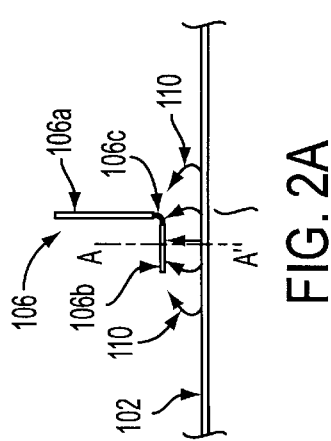
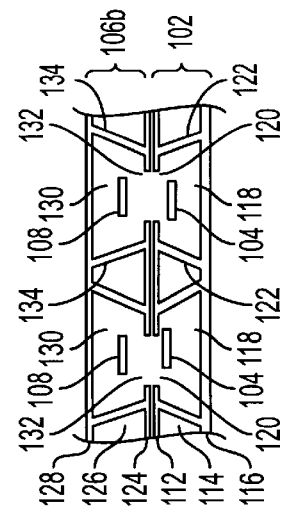

TECHNIQUE FOR COUPLING SIGNALS BETWEEN CIRCUIT BOARDS

CROSS-REFERENCE TO RELATED APPLICATIONS

This patent application is a continuation-in-part patent application of U.S. patent application Ser. No. 09/443,128, filed Nov. 18, 1999, which is hereby incorporated by reference herein in its entirety.

FIELD OF THE INVENTION

The present invention relates generally to the making of electrical signal connections between circuit boards and, more particularly, to a technique for coupling signals between circuit boards.

BACKGROUND OF THE INVENTION

In many computer systems, electronic components are typically mounted on a plurality of circuit boards. These circuit boards, often referred to as daughterboards, are typically mounted on a motherboard so as to allow electrical connections to be made between the electronic components mounted on the daughterboards. The mounting of the daughterboards on the motherboard is typically accomplished through conventional pin-and-box connectors. However, there are intrinsic and mechanical related parasitics associated with these conventional pin-and-box board-to-board connectors. These parasitics put limits on maximum signal transmission bandwidth across the mother and daughter boards. In fact, the best connector that is presently known in the industry claims to be able to handle 5 Gb/s, which cannot meet the bandwidth demands associated with new telecommunication systems, which are on the order of 10 Gb/s.

There are also space concerns associated with the use of conventional pin-and-box board-to-board connectors. That is, conventional pin-and-box board-to-board connectors typically have bulky mechanical shrouds which take up valuable board and box space.

In view of the foregoing, it would be desirable to provide a technique for making electrical signal connections between circuit boards which overcomes the above-described inadequacies and shortcomings. More particularly, it would be desirable to provide a technique for coupling signals between circuit boards while eliminating problems associated with mechanical electrical connectors.

SUMMARY OF THE INVENTION

According to the present invention, a technique for coupling a signal between a first circuit board and a second circuit board is provided. In one embodiment, the first circuit board has a first signal conductor formed therein, and the second circuit board has a second signal conductor formed therein. Also, the first signal conductor is shielded by a first electrically conductive shield, and the second signal conductor is shielded by a second electrically conductive shield. In this embodiment, the technique is realized by forming a first opening in the first electrically conductive shield so as to expose the first signal conductor in the first circuit board, and forming a second opening in the second electrically conductive shield so as to expose the second signal conductor in the second circuit board. The first circuit board and the second circuit board are then positioned such that the first opening and the second opening are aligned and a signal propagating along the first signal conductor is coupled to the second signal conductor.

The present invention is particularly beneficial if the signal is a high speed signal carrying data at a rate on the order of 1 Gb/s and above.

In accordance with other aspects of the present invention, a high dielectric constant material is beneficially disposed between the first circuit board and the second circuit board in the area where the first opening and the second opening are aligned.

In accordance with further aspects of the present invention, the first circuit board and the second circuit board are typically multilayer circuit boards, wherein the first electrically conductive shield and the second electrically conductive shield are respective electrically conductive layers of the first circuit board and the second circuit board. The first electrically conductive shield and the second electrically conductive shield are preferably respective ground plane layers of the first circuit board and the second circuit board. Also, the first signal conductor and the second signal conductor are typically formed on respective signal layers of the first circuit board and the second circuit board, wherein the signal layers are disposed beneath the ground plane layers in the first circuit board and the second circuit board.

In accordance with still further aspects of the present invention, wherein the signal is a first signal, the first circuit board may have a third signal conductor formed therein, and the second circuit board may have a fourth signal conductor formed therein. The third signal conductor may be shielded by a third electrically conductive shield, and the second signal conductor may be shielded by a fourth electrically conductive shield. Then, a third opening may beneficially be formed in the third electrically conductive shield so as to expose the third signal conductor in the first circuit board. Also, a fourth opening may beneficially be formed in the fourth electrically conductive shield so as to expose the fourth signal conductor in the second circuit board. Further, the first circuit board and the second circuit board may beneficially be positioned such that the third opening and the fourth opening are aligned and a second signal propagating along the third signal conductor is coupled to the fourth signal conductor. Typically, the third electrically conductive shield is electrically connected to the first electrically conductive shield, and the fourth electrically conductive shield is electrically connected to the second electrically conductive shield.

In accordance with still further aspects of the present invention, the first circuit board may be a motherboard, and the second circuit board may be a daughterboard. The daughterboard is beneficially formed at least partially of flexible material so as to allow angular mating with the motherboard.

In an alternate embodiment, the first circuit board has a first signal conductor formed therein, and the second circuit board has a second signal conductor formed therein, but only the first signal conductor is shielded by an electrically conductive shield. In this embodiment, the technique is realized by forming an opening in the electrically conductive shield so as to expose the first signal conductor in the first circuit board. The first circuit board and the second circuit board are then positioned such that the first signal conductor and the second signal conductor are aligned through the opening and a signal propagating along the first signal conductor is coupled to the second signal conductor.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

FIG. 2 is a perspective view of a motherboard/daughterboard interface configuration in accordance with the present invention.

FIG. 2a is a expanded side view of a portion of the motherboard/daughterboard interface configuration shown in FIG. 2.

FIG. 2b is a end cross-sectional view of the portion of the motherboard/daughterboard interface configuration shown in FIG. 2a taken along line A—A of FIG. 2a.

DETAILED DESCRIPTION OF EXEMPLARY EMBODIMENT(S)

Figure 1A:
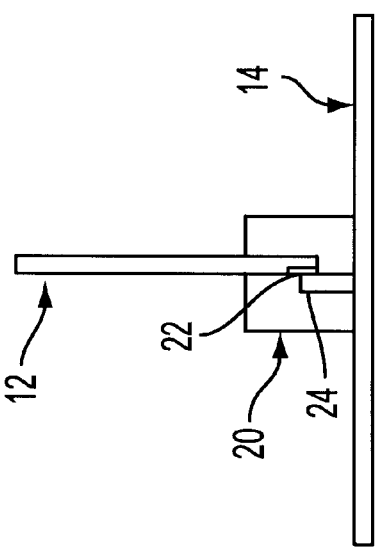
FIG. 1a is a side cross-sectional view of a portion of the conventional motherboard/daughterboard mounting configuration shown in FIG. 1.
Figure 1:
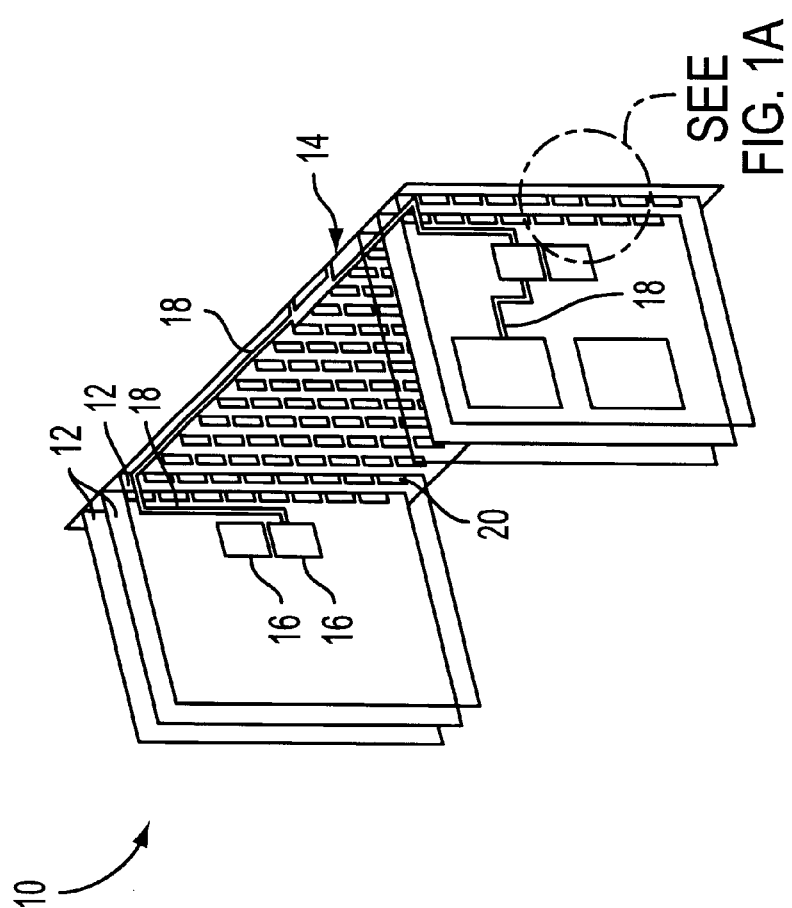
FIG. 1 is a perspective view of a conventional motherboard/daughterboard mounting configuration.

To illustrate the concept of the present invention it is first useful to show a conventional motherboard/daughterboard mounting configuration. Referring to FIG. 1, there is shown such a conventional motherboard/daughterboard mounting configuration 10, wherein a plurality of daughterboards 12 are shown mounted to a single motherboard 14. Each daughterboard 12 has electronic components 16 mounted thereon which are electrically connected to each other by signal conductors 18 in both the daughterboards 12 and the motherboard 14. The signal conductors 18 in the daughterboards 12 and the motherboard 14 are electrically connected via pin-and-box connectors 20. That is, electrically conductive contact pads 22 on the daughterboards 12 are placed into electrical contact with electrically conductive pins 24 within the pin-and-box connectors 20 (see FIG. 1a) The electrically conductive pins 24 are electrically connected to electrically conductive contact pads or vias (not shown) on the motherboard 14. The electrically conductive contact pads 22 on the daughterboards 12 and the electrically conductive contact pads or vias on the motherboard 14 are in electrical connection with the signal conductors 18 in the daughterboards 12 and the motherboard 14, respectively. The pin-and-box connectors 20 are typically constructed such that the daughterboards 12 are oriented at 90° with respect to the motherboard 14, as shown.

Referring to FIG. 2, there is shown a motherboard/daughterboard interface configuration 100 in accordance with the present invention. The interface configuration 100 comprises a motherboard 102 having a plurality of signal conductors 104 formed therein. The interface configuration 100 also comprises a daughterboard 106 also having a plurality of signal conductors 108 formed therein. The daughterboard 106 has an upper rigid portion 106a and a lower rigid portion 106b connected by a middle flexible portion 106c. The signal conductors 108 are formed in and pass through all of these portions 106a, 106b, and 106c, as shown. The middle flexible portion 106c allows the upper rigid portion 106a to be substantially perpendicular to the motherboard 102 (as in conventional motherboard/daughterboard mounting configurations), while allowing the lower rigid portion 106b to be substantially parallel to the motherboard 102. It should be noted that the present invention is not limited in the regard. For example, the daughterboard 106 could be entirely flexible or entirely rigid.

Referring to FIG. 2a, a plurality of electromagnetic field flux lines 110 are shown emanating from the motherboard 102 and directed toward the lower rigid portion 106b of the daughterboard 106. The electromagnetic field flux lines 110 are generated by a signal propagating along one of the signal conductors 104 formed in the motherboard 102. The electromagnetic field flux lines 110 are received by one of the signal conductors 108 formed in the lower rigid portion 106b of the daughterboard 106, as described in more detail below.

Referring to FIG. 2b, only the top layers of the motherboard 102 and the bottom layers of the lower rigid portion 106b of the daughterboard 106 are shown. The motherboard 102 comprises a top electrically conductive ground plane layer 112, a signal layer 114, and a buried electrically conductive ground plane layer 116. The signal layer 114 has the signal conductors 104 formed therein. The signal conductors 104 are surrounded by a dielectric material 118. The top ground plane layer 112 has openings 120 formed therein so as to expose at least a portion of the signal conductors 104 in accordance with the present invention. Connecting the top ground plane layer 112 and the buried ground plane layer 116 are a plurality of electrically conductive groove walls 122 which extend along the entire length of the signal conductors 104 within the motherboard 102. Thus, each signal conductor 104 is enclosed by a continuous electrically conductive shield, except where the openings 120 are formed in the top ground plane layer 112. These continuous electrically conductive shields are beneficial for reducing or eliminating cross-talk between signals propagating along adjacent signal conductors 104, as described in related U.S. patent application Ser. No. 09/443,128, filed Nov. 18, 1999, which is incorporated by reference herein in its entirety.

At this point it should be noted that the grooves formed by the plurality of electrically conductive groove walls 122 which extend along the entire length of the signal conductors 104 within the motherboard 102 are typically filled with a dielectric material.

The lower rigid portion 106b of the daughterboard 106 comprises a bottom electrically conductive ground plane layer 124, a signal layer 126, and a buried electrically conductive ground plane layer 128. The signal layer 126 has the signal conductors 108 formed therein. The signal conductors 108 are surrounded by a dielectric material 130. The bottom ground plane layer 124 has openings 132 formed therein so as to expose at least a portion of the signal conductors 108 in accordance with the present invention. Connecting the bottom ground plane layer 124 and the buried ground plane layer 128 are a plurality of electrically conductive groove walls 134 which extend along the entire length of the signal conductors 108 within the lower rigid portion 106b of the daughterboard 106. Thus, each signal conductor 108 is enclosed by a continuous electrically conductive shield, except where the openings 132 are formed in the bottom ground plane layer 124. These continuous electrically conductive shields are beneficial for reducing or eliminating cross-talk between signals propagating along adjacent signal conductors 108, as described in related U.S. patent application Ser. No. 09/443,128, filed Nov. 18, 1999, which is incorporated by reference herein in its entirety.

The openings 120 formed in the top ground plane layer 112 of the motherboard 102 and the openings 132 formed in the bottom ground plane layer 124 of the lower rigid portion 106b of the daughterboard 106 are aligned, as shown, so as to allow an electromagnetic field (e.g., represented by electromagnetic field flux lines 110 in FIG. 2a) generated by a signal propagating along one of the signal conductors 104 formed in the motherboard 102 to be received by a corresponding one of the signal conductors 108 formed in the lower rigid portion 106b of the daughterboard 106. The electromagnetic field received at the corresponding one of the signal conductors 108 formed in the lower rigid portion 106b of the daughterboard 106 causes a representative signal to be formed in the corresponding one of the signal conductors 108 formed in the lower rigid portion 106b of the daughterboard 106 by way of electromagnetic coupling. Of course, this technique may be reversed wherein a signal propagating along one of the signal conductors 108 formed in the lower rigid portion 106b of the daughterboard 106 may cause a representative signal to be formed in a corresponding one of the signal conductors 104 formed in the motherboard 102 by way of electromagnetic coupling.

At this point it should be noted that the grooves formed by the plurality of electrically conductive groove walls 134 which extend along the entire length of the signal conductors 108 within the lower rigid portion 106b of the daughterboard 106 are typically filled with a dielectric material.

It should also be noted that signal conductors 104 and 108 are typically 0.010 inches wide. Also, the signal conductors 104 and 108 are typically spaced 0.002 inches from both the top ground plane layer 112 and the buried ground plane layer 116 in the motherboard 102, and from both the bottom ground plane layer 124 and the buried ground plane layer 128 in the lower rigid portion 106b of the daughterboard 106, respectively. Further, the signal conductors 104 and 108 are typically spaced 0.010 inches from the electrically conductive groove walls 122 in the motherboard 102, and from the electrically conductive groove walls 134 in the lower rigid portion 106b of the daughterboard 106, respectively. Further still, the electrically conductive groove walls 122 in the motherboard 102, and the electrically conductive groove walls 134 in the lower rigid portion 106b of the daughterboard 106, are typically spaced 0.010 inches apart at the point of their greatest separation (i.e., at the top/bottom ground plane layers).

It should further be noted that a high dielectric constant material is preferably deposited between the motherboard 102 and the lower rigid portion 106b of the daughterboard 106 in the areas of the openings 120 and 132, respectively, so as to increase the coupling efficiency between the signal conductors 104 and 108. One example of such a high dielectric constant material is barium titanate trioxide, $BaTiO_3$.

Figure 3:
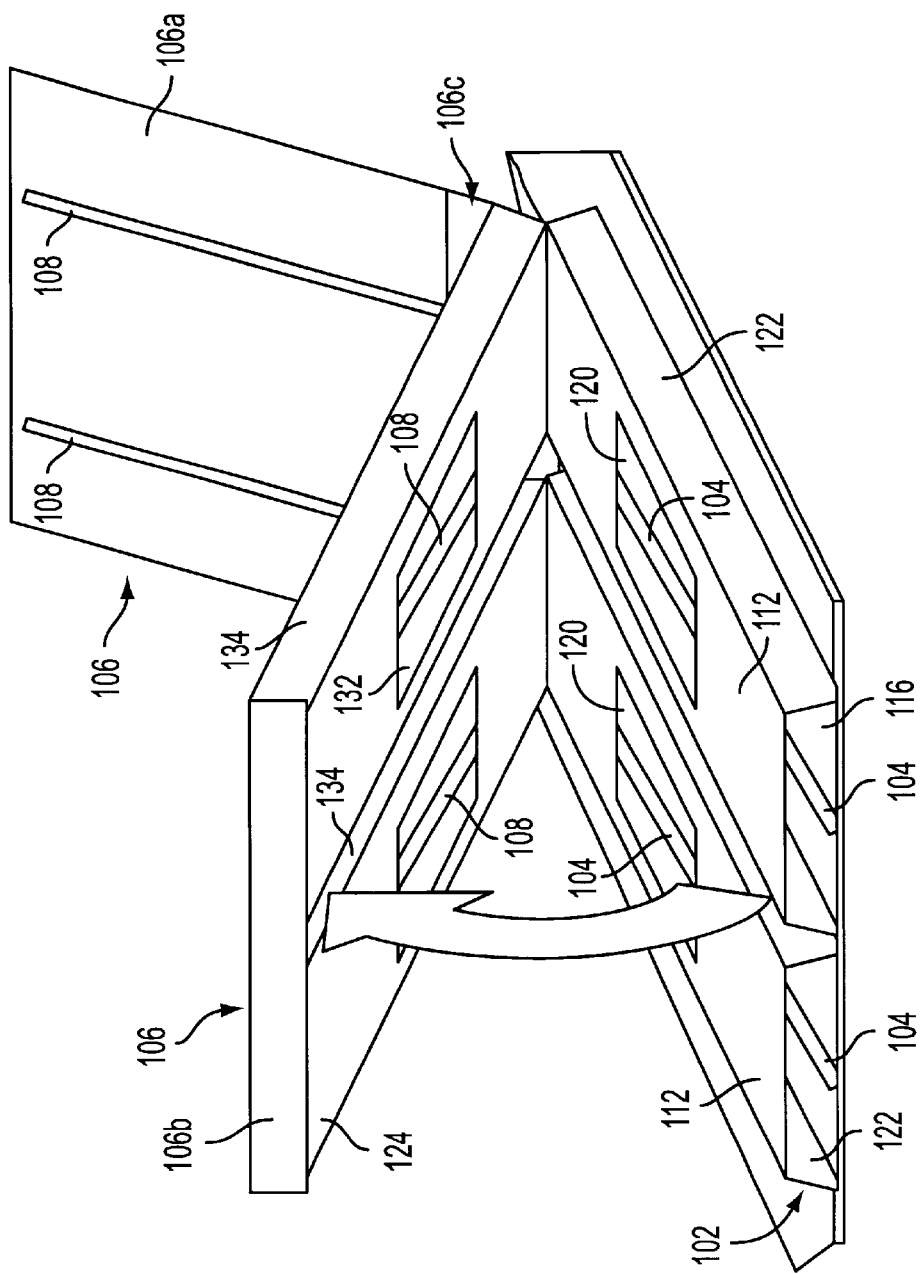
FIG. 3 is a perspective view of the motherboard/daughterboard interface configuration shown in FIG. 2 with the entire daughterboard rotated away from the motherboard.

Referring to FIG. 3, the motherboard/daughterboard interface configuration 100 is shown with the entire daughterboard 106 rotated away from the motherboard 102 so as to provide a better understanding of the present invention. Also, dielectric materials 118 and 130 have been removed so as to provide a clearer picture of the internal layers of both the motherboard 102 and the daughterboard 106, respectively. Further, a portion of the top ground plane layer 112 of the motherboard 102 above the electrically conductive groove walls 122, and a portion of the bottom ground plane layer 124 of the lower rigid portion 106b of the daughterboard 106 below the electrically conductive groove walls 134 have been removed so as to provide a clearer picture of the electrically conductive groove walls 122 and the electrically conductive groove walls 134, respectively.

Figure 4:
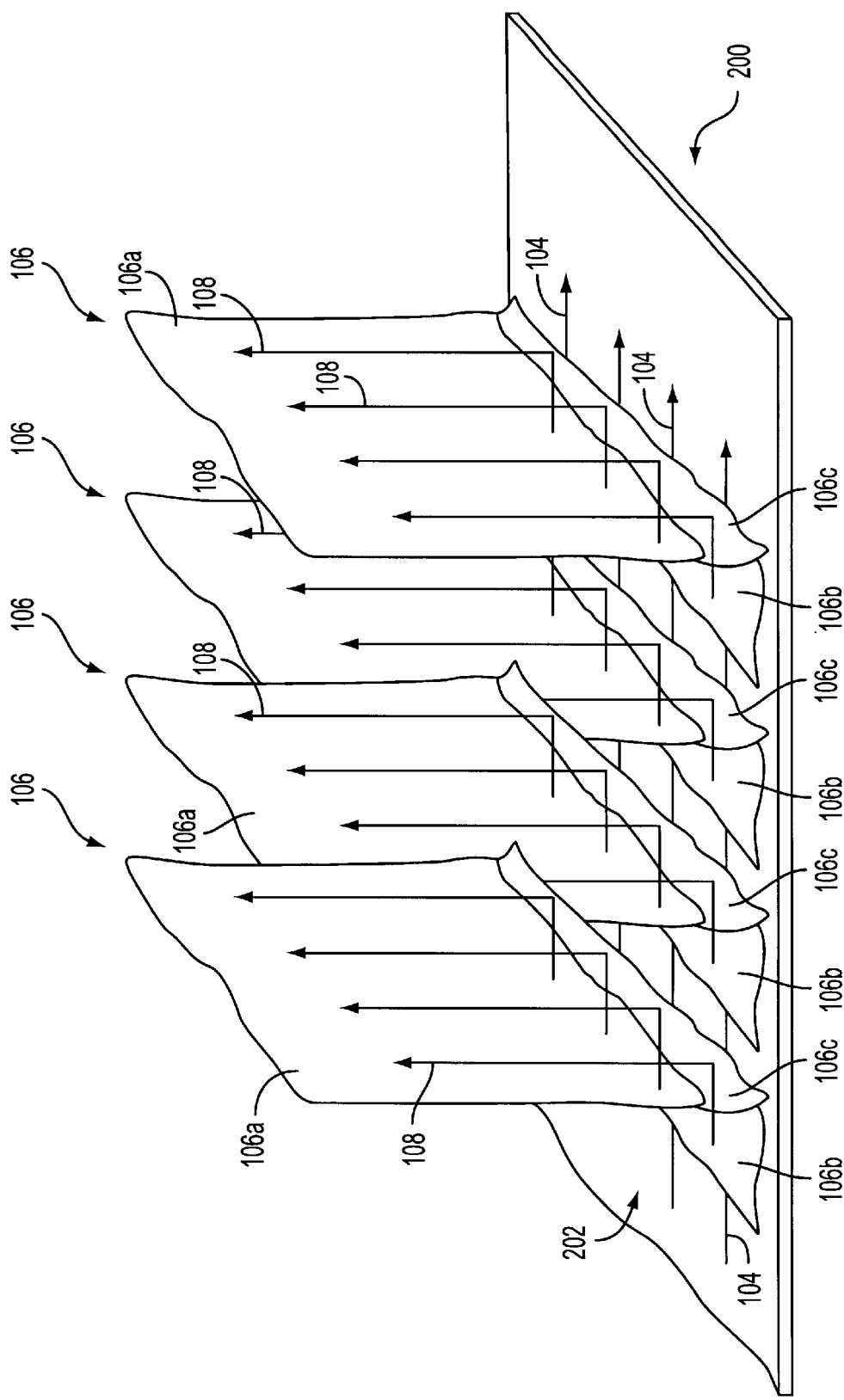
FIG. 4 is a perspective view of a second embodiment of a motherboard/daughterboard interface configuration in accordance with the present invention.

Referring to FIG. 4, there is shown a second embodiment of a motherboard/daughterboard interface configuration 200 in accordance with the present invention wherein a plurality of daughterboards 106 are shown interfacing with a single-sided motherboard 202. All of the daughterboards 106 interface with the single-sided motherboard 202 in accordance with the present invention in the manner described above.

Figure 5:
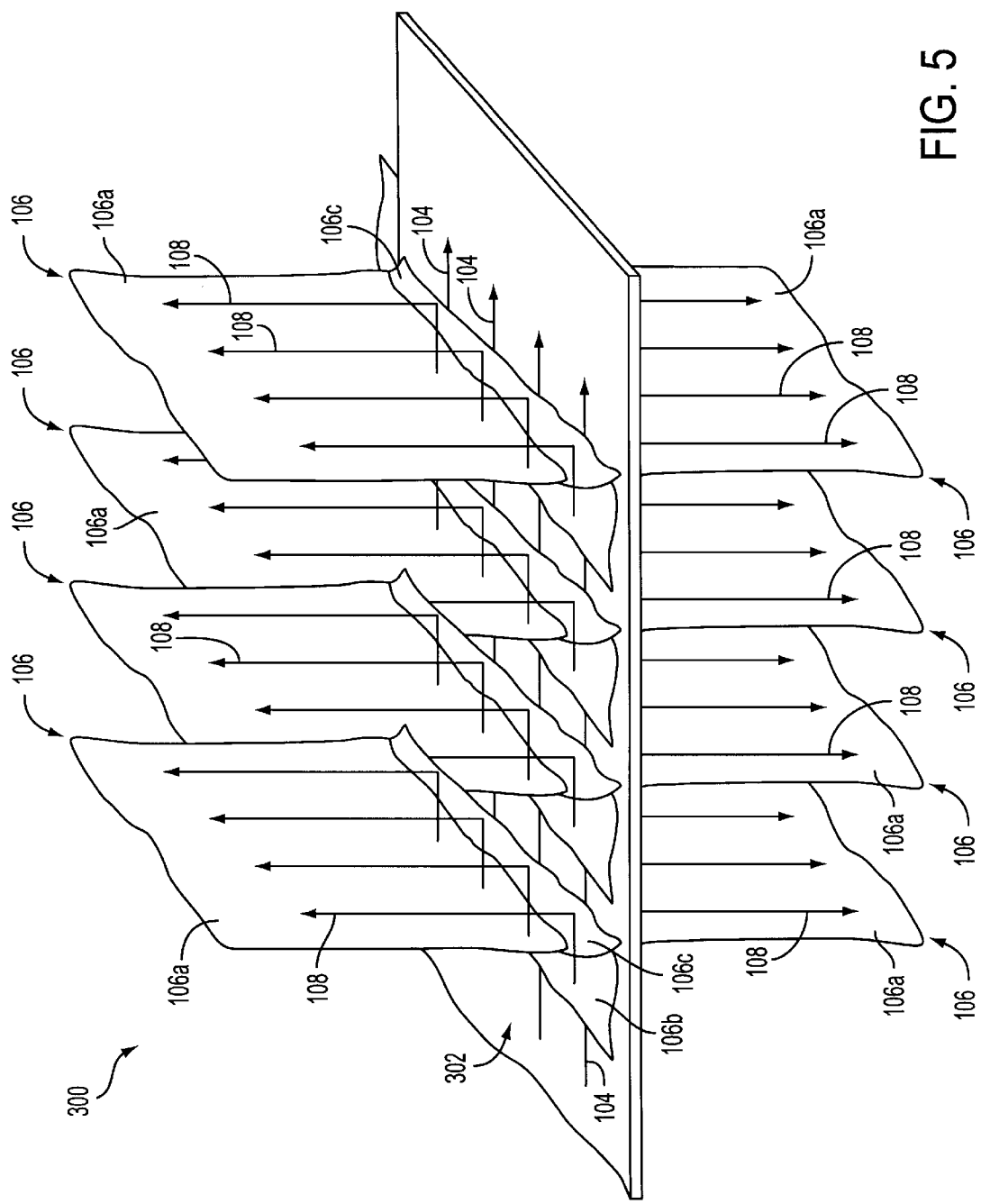
FIG. 5 is a perspective view of a third embodiment of a motherboard/daughterboard interface configuration in accordance with the present invention.

Referring to FIG. 5, there is shown a third embodiment of a motherboard/daughterboard interface configuration 300 in accordance with the present invention wherein a plurality of daughterboards 106 are shown interfacing with a double-sided motherboard 302. All of the daughterboards 106 interface with the double-sided motherboard 302 in accordance with the present invention in the manner described above.

At this point it should be noted that in all of the above-described embodiments only one of the signal conductors may have a shield with an opening and the circuit boards may be positioned such that the signal conductors are aligned through the opening and a signal propagating along a first signal conductor in a first circuit board is coupled to a second signal conductor in a second circuit board.

In view of the foregoing, it is apparent that the present invention provides a technique for coupling signals between circuit boards wherein the need for conventional mechanical connectors is totally eliminated. The elimination of conventional mechanical connectors results in the elimination of parasitics that are typically associated with conventional mechanical connectors, thereby resulting in better signal integrity. Also, there are no longer any costs for purchasing connectors, as well as no assembly costs for mounting the connectors on a motherboard. Further, by incorporating the shielding concept described in related U.S. patent application Ser. No. 09/443,128, filed Nov. 18, 1999, which is incorporated by reference herein in its entirety, there is minimal or no unwanted signal cross-talk. Thus, the present invention is particularly beneficial for high speed signal applications.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for coupling a signal between a first circuit board and a second circuit board, the first circuit board having a first signal conductor formed therein, the second circuit board having a second signal conductor formed therein, the first signal conductor being shielded by a first electrically conductive shield, the second signal conductor being shielded by a second electrically conductive shield, the method comprising the steps of:

forming a first opening in the first electrically conductive shield so as to expose the first signal conductor in the first circuit board;

forming a second opening in the second electrically conductive shield so as to expose the second signal conductor in the second circuit board; and positioning the first circuit board and the second circuit board such that the first opening and the second opening are aligned and a signal propagating along the first signal conductor is electromagnetically coupled to the second signal conductor.

2. The method as defined in claim 1, further comprising the step of:

placing a high dielectric constant material between the first circuit board and the second circuit board in the area where the first opening and the second opening are aligned.

3. The method as defined in claim 1, wherein the first circuit board and the second circuit board are multilayer circuit boards, wherein the first electrically conductive shield and the second electrically conductive shield are respective electrically conductive layers of the first circuit board and the second circuit board.

4. The method as defined in claim 3, wherein the first electrically conductive shield and the second electrically conductive shield are respective ground plane layers of the first circuit board and the second circuit board.

5. The method as defined in claim 4, wherein the first signal conductor and the second signal conductor are formed on respective signal layers of the first circuit board and the second circuit board, wherein the signal layers are disposed beneath the ground plane layers in the first circuit board and the second circuit board.

6. The method as defined in claim 1, wherein the signal is a high speed signal carrying data at a rate on the order of 1 Gb/s and above.

7. The method as defined in claim 1, wherein the signal is a first signal, wherein the first circuit board has a third signal conductor formed therein, wherein the second circuit board has a fourth signal conductor formed therein, the third signal conductor being shielded by a third electrically conductive shield, the second signal conductor being shielded by a fourth electrically conductive shield, further comprising the steps of:

forming a third opening in the third electrically conductive shield so as to expose the third signal conductor in the first circuit board;

forming a fourth opening in the fourth electrically conductive shield so as to expose the fourth signal conductor in the second circuit board; and positioning the first circuit board and the second circuit board such that the third opening and the fourth opening are aligned and a second signal propagating along the third signal conductor is coupled to the fourth signal conductor.

8. The method as defined in claim 7, wherein the third electrically conductive shield is electrically connected to the first electrically conductive shield, wherein the fourth electrically conductive shield is electrically connected to the second electrically conductive shield.

9. The method as defined in claim 1, wherein the first circuit board is a motherboard, wherein the second circuit board is a daughterboard.

10. The method as defined in claim 9, wherein the daughterboard is formed at least partially of flexible material so as to allow angular mating with the motherboard.

11. A system for coupling a signal between circuit boards, the system comprising:

a first circuit board having a first signal conductor formed therein, the first signal conductor being shielded by a first electrically conductive shield, the first electrically conductive shield having a first opening formed therein so as to expose the first signal conductor in the first circuit board;

a second circuit board having a second signal conductor formed therein, the second signal conductor being shielded by a second electrically conductive shield, the second electrically conductive shield having a second opening formed therein so as to expose the second signal conductor in the second circuit board;

wherein the first circuit board and the second circuit board are positioned such that the first opening and the second opening are aligned and a signal propagating along the first signal conductor is electromagnetically coupled to the second signal conductor.

12. The system as defined in claim 11, further comprising:

a high dielectric constant material disposed between the first circuit board and the second circuit board in the area where the first opening and the second opening are aligned.

13. The system as defined in claim 11, wherein the first circuit board and the second circuit board are multilayer circuit boards, wherein the first electrically conductive shield and the second electrically conductive shield are respective electrically conductive layers of the first circuit board and the second circuit board.

14. The system as defined in claim 13, wherein the first electrically conductive shield and the second electrically conductive shield are respective ground plane layers of the first circuit board and the second circuit board.

15. The system as defined in claim 14, wherein the first signal conductor and the second signal conductor are formed on respective signal layers of the first circuit board and the second circuit board, wherein the signal layers are disposed beneath the ground plane layers in the first circuit board and the second circuit board.

16. The system as defined in claim 11, wherein the signal is a high speed signal carrying data at a rate on the order of 1 Gb/s and above.

17. The system as defined in claim 11, wherein the signal is a first signal;

wherein the first circuit board has a third signal conductor formed therein, wherein the third signal conductor is shielded by a third electrically conductive shield, wherein a third opening is formed in the third electrically conductive shield so as to expose the third signal conductor in the first circuit board;

wherein the second circuit board has a fourth signal conductor formed therein, wherein the second signal conductor is shielded by a fourth electrically conductive shield, wherein a fourth opening is formed in the fourth electrically conductive shield so as to expose the fourth signal conductor in the second circuit board; and wherein the first circuit board and the second circuit board are positioned such that the third opening and the fourth opening are aligned and a second signal propagating along the third signal conductor is coupled to the fourth signal conductor.

18. The system as defined in claim 17, wherein the third electrically conductive shield is electrically connected to the first electrically conductive shield, wherein the fourth electrically conductive shield is electrically connected to the second electrically conductive shield.

19. The system as defined in claim 11, wherein the first circuit board is a motherboard, wherein the second circuit board is a daughterboard.

20. The system as defined in claim 19, wherein the daughterboard is formed at least partially of flexible material so as to allow angular mating with the motherboard.

21. A method for coupling a signal between a first circuit board and a second circuit board, the first circuit board having a first signal conductor formed therein, the second circuit board having a second signal conductor formed therein, the first signal conductor being shielded by an electrically conductive shield, the method comprising the steps of:

forming an opening in the electrically conductive shield so as to expose the first signal conductor in the first circuit board; and positioning the first circuit board and the second circuit board such that the first signal conductor and the second signal conductor are aligned through the opening and a signal propagating along the first signal conductor is electromagnetically coupled to the second signal conductor.

22. A system for coupling a signal between circuit boards, the system comprising:

a first circuit board having a first signal conductor formed therein, the first signal conductor being shielded by a first electrically conductive shield, the first electrically conductive shield having a first opening formed therein so as to expose the first signal conductor in the first circuit board; and a second circuit board having a second signal conductor formed therein;

wherein the first circuit board and the second circuit board are positioned such that the first signal conductor and the second signal conductor are aligned through the opening and a signal propagating along the first signal conductor is electromagnetically coupled to the second signal conductor.

* * * * *